(12) United States Patent
Eimitsu et al.

(10) Patent No.: US 7,443,207 B2
(45) Date of Patent: Oct. 28, 2008

(54) DIFFERENTIAL OUTPUT CIRCUIT WITH STABLE DUTY

(75) Inventors: Masatomo Eimitsu, Kanagawa (JP); Yasushi Aoki, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/507,622

(22) Filed: Aug. 22, 2006

(65) Prior Publication Data

US 2007/0046333 A1 Mar. 1, 2007

(30) Foreign Application Priority Data

Aug. 23, 2005 (JP) ............................. 2005-240748

(51) Int. Cl.
*G01R 19/00* (2006.01)
(52) U.S. Cl. ............................. 327/52; 327/55; 327/57
(58) Field of Classification Search .................. 327/52, 327/54–57, 65, 67, 333; 330/252, 253; 326/62, 326/68, 80
See application file for complete search history.

(56) References Cited

U.S. PATENT DOCUMENTS

| | | | | | |
|---|---|---|---|---|---|
| 4,606,012 | A | * | 8/1986 | Koshizuka | 327/55 |
| 4,616,148 | A | * | 10/1986 | Ochii et al. | 327/55 |
| 4,816,706 | A | * | 3/1989 | Dhong et al. | 327/57 |
| 5,347,183 | A | * | 9/1994 | Phelan | 327/52 |
| 5,378,932 | A | * | 1/1995 | Shin et al. | 327/333 |
| 6,437,627 | B1 | * | 8/2002 | Tran et al. | 327/333 |
| 6,522,164 | B2 | * | 2/2003 | Barnes | 326/27 |
| 6,842,043 | B1 | * | 1/2005 | Nguyen et al. | 326/68 |
| 6,930,518 | B2 | * | 8/2005 | Kim et al. | 327/112 |
| 6,967,504 | B2 | | 11/2005 | Aoki | |
| 7,061,299 | B2 | * | 6/2006 | Khan et al. | 327/333 |

FOREIGN PATENT DOCUMENTS

JP 2004-128747 4/2004

* cited by examiner

*Primary Examiner*—Kenneth B. Wells
*Assistant Examiner*—Hai L. Nguyen
(74) *Attorney, Agent, or Firm*—Foley & Lardner LLP

(57) ABSTRACT

A differential output circuit includes a bias circuit connected with a first voltage. An input circuit section includes first and second MOS transistors of a first conductive type, and the first and second MOS transistors are connected with the first voltage through the bias circuit, and gates of the first and second MOS transistors receive a differential input signal. Third and fourth MOS transistors of a second conductive type are connected with the first and second MOS transistors through first and second resistance elements, respectively, and connected with a second voltage. A first connection node between the first MOS transistor and the first resistance element is connected with a gate of the fourth MOS transistor, and a second connection node between the second MOS transistor and the second resistance element is connected with a gate of the third MOS transistor. A differential output signal is outputted from a first output node between the first resistance element and the third MOS transistor and a second output node between the second resistance element and the fourth MOS transistor in response to the differential input signal.

11 Claims, 10 Drawing Sheets

INPUT WAVEFORM

OUTPUT WAVEFORM

OUTPUT WAVEFORM IN
CONVENTIONAL CIRCUIT

US 7,443,207 B2

DIFFERENTIAL OUTPUT CIRCUIT WITH STABLE DUTY

BACKGROUND OF THE INVENTION

1. Field of the Invention

The present invention relates to a differential output circuit which outputs a differential signal in response to a differential input signal.

2. Description of the Related Art

In association with a high-speed operation of a semiconductor integrated circuit, a differential signal is often used in an interface between circuits. The differential signal is superior in noise resistance and hard to receive the influence of variation in manufacturing the circuit. A differential output circuit for generating the differential signal is disclosed in Japanese Laid Open Patent Application (JP P2004-128747A). FIG. 1 is its circuit diagram. As shown in FIG. 1, the differential output circuit is provided with N-channel MOS transistors N11a, N11b, N12a and N12b, and P-channel MOS transistors P11a, P11b and a resistance element R.

The MOS transistors P11a, N12a and N11a are connected in series between a higher voltage power source VDD and a lower voltage power source VSS. That is, a source of the N-channel MOS transistor N11a is connected to the lower voltage power source VSS, and a drain of the N-channel MOS transistor N11a is connected to a source of the N-channel MOS transistor N12a. A source of the P-channel MOS transistor P11a is connected to the higher voltage power source VDD, and a drain of the P-channel MOS transistor P11a is connected to a drain of the N-channel MOS transistor N12a. Similarly, the MOS transistors P11b, N12b and N11b are connected in series between the higher voltage power source VDD and the lower voltage power source VSS. That is, a source of the N-channel MOS transistor N11b is connected to the lower voltage power source VSS, and a drain of the N-channel MOS transistor N11b is connected to a source of the N-channel MOS transistor N12b. A source of the P-channel MOS transistor P11b is connected to the higher voltage power source VDD, and a drain of the P-channel MOS transistor P11b is connected to a drain of the N-channel MOS transistor N12b.

A gate of the N-channel MOS transistor N12a and a gate of the N-channel MOS transistor N12b are connected to the higher voltage power source VDD. Thus, the N-channel MOS transistor N12a and the N-channel MOS transistor N12b are always on and function as resistance elements. An input terminal INa is connected to a gate of the N-channel MOS transistor N11a, and an input terminal INb is connected to a gate of the N-channel MOS transistor N11b. An input signal supplied from the input terminal INa and an input signal supplied from the input terminal INb serve as a differential signal and have phases opposite to each other.

A node a between the N-channel MOS transistor N12a and the N-channel MOS transistor N11a is connected to the gate of the P-channel MOS transistor P11b. A node b between the N-channel MOS transistor N12b and the N-channel MOS transistor N11b is connected to the gate of the P-channel MOS transistor P11a. A node between the N-channel MOS transistor N12a and the P-channel MOS transistor P11a is connected to an output terminal OUTb, and a node between the N-channel MOS transistor N12b and the P-channel MOS transistor P11b is connected to an output terminal OUTa. The resistance element R is connected between the output terminal OUTa and the output terminal OUTb.

An operation of the differential output circuit will be described below. The circuit shown in FIG. 1 could be considered to be the synthesis of two circuits section for two signal routes. The first signal route is the signal route for receiving a signal from the input terminal INa and outputting the signal from the output terminal OUTa. The second signal route is the signal route for receiving a signal from the input terminal INb and outputting the signal from the output terminal OUTb.

In the first signal route, the N-channel MOS transistor N11a constitutes a source grounded amplifying circuit having, as a load resistor, the N-channel MOS transistor N12a and the P-channel MOS transistor P11a. Its output is obtained from the connection node a between the load resistor and the N-channel MOS transistor N11a. The signal on this node a is supplied to the gate of the P-channel MOS transistor P11b. The P-channel MOS transistor P11b constitutes a source grounded amplifying circuit having, as a load resistor, the N-channel MOS transistor N11b and the N-channel MOS transistor N12b. Thus, the signal supplied from the input terminal INa is amplified by the two-stage amplifying circuit composed of the N-channel MOS transistor N11a and the P-channel MOS transistor P11b, and outputted from the output terminal OUTa. The output signal outputted to the output terminal OUTa is negatively fed back through the resistance element R to the input side. Thus, the gain of the two-stage amplifying circuit is suppressed, thereby enlarging the flat band range in a frequency property.

Similarly, in the second signal route, the N-channel MOS transistor N11b constitutes a source grounded amplifying circuit having, as a load resistor, the N-channel MOS transistor N12b and the P-channel MOS transistor P11b. Its output is obtained from the connection node b between the load resistor and the N-channel MOS transistor N11b. The signal on this node b is supplied to the gate of the P-channel MOS transistor P11a. The P-channel MOS transistor P11a constitutes a source grounded amplifying circuit having, as a load resistor, the N-channel MOS transistor N11a and the N-channel MOS transistor N12a. Thus, the signal supplied from the input terminal INb is amplified by the two-stage amplifying circuit composed of the N-channel MOS transistor N11b and the P-channel MOS transistor P11a, and outputted from the output terminal OUTb. The output signal outputted to the output terminal OUTb is negatively fed back through the resistance element R to the input side. Thus, the gain of the two-stage amplifying circuit is suppressed, thereby enlarging the flat band range in the frequency property.

The signal supplied to the input terminal INa and the signal supplied to the input terminal INb serve as the differential signal and have the phases opposite to each other. In those input signals, small signals are superimposed on offset voltage signals. Thus, if the signal supplied to the input terminal INa is higher than its offset voltage signal, the signal supplied to the input terminal INb is lower than the offset voltage signal. For this reason, the voltage of the node b is higher than the voltage when the offset voltage signal is applied to the input terminal INb. The voltage of the node b is applied to the gate of the P-channel MOS transistor P11a serving as the load resistor of the N-channel MOS transistor N11a, so that the ON resistance of the P-channel MOS transistor P11a is high. Therefore, the amplification factor of the signal supplied from the input terminal INa through the N-channel MOS transistor N11a is made higher. In short, the amplifying operation is made stronger as compared with a case where only the single N-channel MOS transistor N11a is use. The frequency performance of this circuit has the flat gain of about 12 dB to about 2 GHz, as shown by a dashed line in FIG. 3, when proper parameters are set and SPICE is used to carry out a simulation.

As mentioned above, the differential output circuit shown in FIG. 1 can process the signal in the wide frequency band. Usually, a differential signal supplied to the input terminals INa and INb has offsets that are approximately equal. However, as shown in FIG. 4A, if the offsets of the differential signal supplied to the input terminals INa and INb are different (difference x), the offsets are also amplified, because this differential output circuit has the flat amplifying property over the wide frequency band from a DC component to an AC component. For this reason, the difference between the offsets is also amplified, which increases the difference. In particular, when the frequency of the small signal contains the component of 2 GHz or higher, the amplification factor of the small signal is made lower than the amplification factor of the DC component. Therefore, as shown in FIG. 4C, the difference of the offset is amplified to x", and the signal component is amplified to y". In this case, the duty of the differential signal is deteriorated.

SUMMARY OF THE INVENTION

In an aspect of the present invention, a differential output circuit includes a bias circuit connected with a first voltage. An input circuit section includes first and second MOS transistors of a first conductive type, and the first and second MOS transistors are connected with the first voltage through the bias circuit, and gates of the first and second MOS transistors receive a differential input signal. Third and fourth MOS transistors of a second conductive type are connected with the first and second MOS transistors through first and second resistance elements, respectively, and connected with a second voltage. A first connection node between the first MOS transistor and the first resistance element is connected with a gate of the fourth MOS transistor, and a second connection node between the second MOS transistor and the second resistance element is connected with a gate of the third MOS transistor. A differential output signal is outputted from a first output node between the first resistance element and the third MOS transistor and a second output node between the second resistance element and the fourth MOS transistor in response to the differential input signal.

Here, the first and second resistance elements may be constituted by fifth and sixth MOS transistors of the first conductive type which have gates connected with the second voltage, respectively.

Also, the bias circuit may include a third resistance element connected between the first MOS transistor and the first voltage; a fourth resistance element connected between the second MOS transistor and the first voltage; a first capacitance element connected between the first MOS transistor and the first voltage; and a second capacitance element connected between the second MOS transistor and the first voltage.

In this case, the third and fourth resistance elements may be constituted by seventh and eighth MOS transistors of the first conductive type which have gates connected with the second voltage, respectively. Also, each of the first and second capacitance elements may be constituted by a MOS transistor having a source and a drain connected to the first voltage and a gate connected with a predetermined voltage.

Also, the bias circuit may include a third resistance element connected between the first MOS transistor and the first voltage; a fourth resistance element connected between the second MOS transistor and the first voltage; a capacitance element connected between a first node between the first MOS transistor and the third resistance element and a second node between the second MOS transistor and the fourth resistance element. In this case, the third and fourth resistance elements may be constituted by seventh and eighth MOS transistors of the first conductive type which have gates connected with the second voltage, respectively. Also, the capacitance element may be constituted by a first additional MOS transistor having a source and a drain connected to the first node and a gate connected to the second node and a second additional MOS transistor having a source and a drain connected to the second node and a gate connected to the first node.

Also, the differential output circuit may further include a fifth resistance element between the first and second output nodes. In this case, the fifth resistance element may be constituted by a ninth MOS transistor of the first conductive type which have a gate connected with a predetermined voltage.

Also, the input circuit section may further include tenth and eleventh MOS transistors of the first conductive type which are respectively provided in parallel to the first and second MOS transistors to have gates connected with a second differential input signal. Instead, the input circuit section may further include tenth and eleventh MOS transistors of the first conductive type which are respectively provided in series to the first and second MOS transistors to have gates connected with a second differential input signal.

DESCRIPTION OF THE PREFERRED EMBODIMENTS

Figure 1:
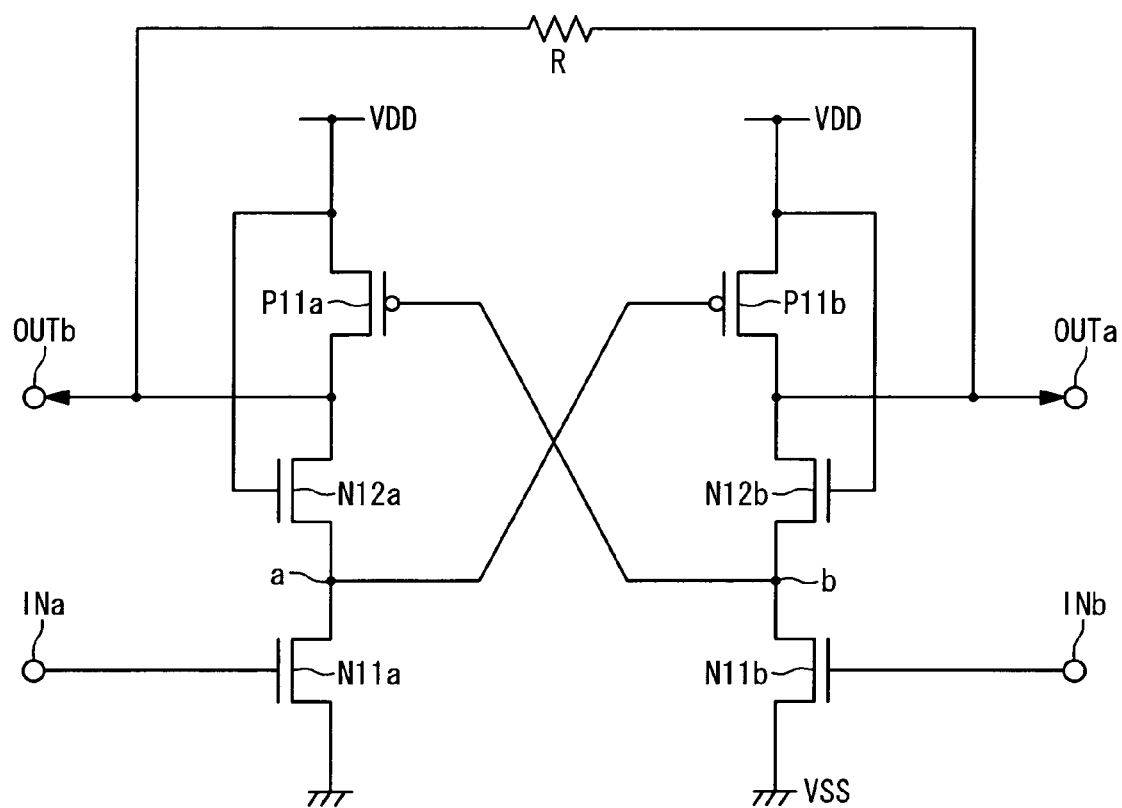
FIG. 1 is a circuit diagram showing a configuration of a conventional differential output circuit.
Figure 2:
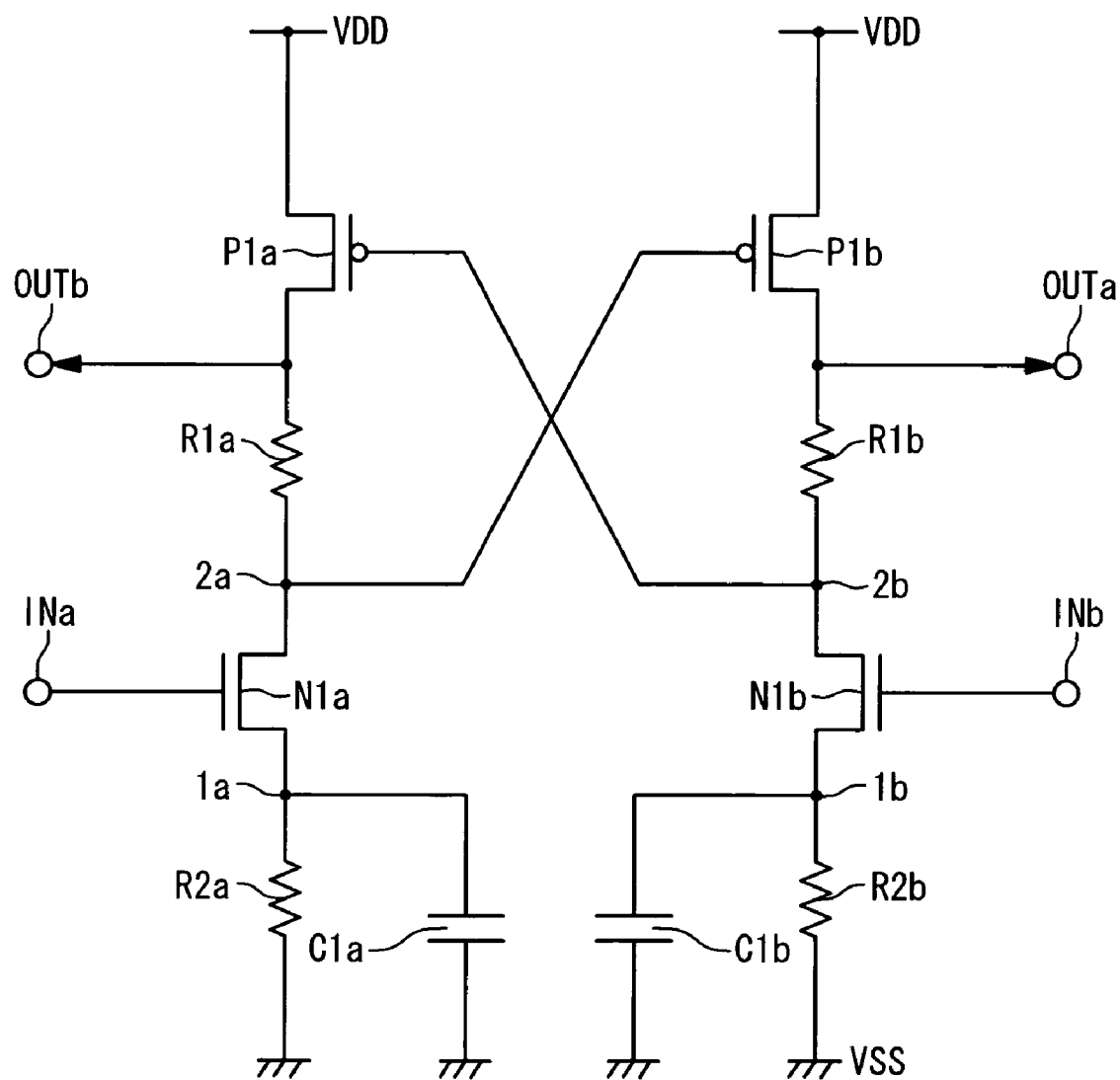
FIG. 2 is a circuit diagram showing the configuration of a differential output circuit according to a first embodiment of the present invention.

Hereinafter, a differential output circuit of the present invention will be described below with reference to the drawings. FIG. 2 is a circuit diagram of a differential output circuit according to the first embodiment of the present invention. The differential output circuit in the first embodiment includes N-channel MOS transistors N1a and N1b, P-channel MOS transistors P1a and P1b, resistance elements R1a, R2a, R1b and R2b, and capacitance elements C1a and C1b.

A parallel connection of the resistance element R2a and the capacitance element C1a, the N-channel MOS transistor N1a, the resistance element R1a and the P-channel MOS transistor P1a are connected in series between a lower voltage power source VSS and a higher voltage power source VDD. That is, a source of the N-channel MOS transistor N1a is connected to the lower voltage power source VSS through the parallel connection of the resistance element R2a and the capacitance element C1a. The parallel connection of the resistance element R2a and the capacitance element C1a serves as a bias circuit for the N-channel MOS transistor N1a. A connection node 1a is between the source of the N-channel MOS transistor N1a and this bias circuit. A drain of the N-channel MOS transistor N1a is connected through the resistance element R1a to a drain of the P-channel MOS transistor P1a. A connection node 2a is between the drain of the N-channel MOS transistor N1a and the resistance element R1a and further connected to a gate of the P-channel MOS transistor P1b. A gate of the N-channel MOS transistor N1a is connected to an input terminal INa. A source of the P-channel MOS transistor P1a is connected to the higher-voltage power source VDD. The connection node between the drain of the P-channel MOS transistor P1a and the resistance element R1a is connected to an output terminal OUTb.

Symmetrically, a parallel connection of the resistance element R2b and the capacitance element C1b, the N-channel MOS transistor N1b, the resistance element R1b and the P-channel MOS transistor P1b are connected in series between the lower voltage power source VSS and the higher voltage power source VDD. That is, a source of the N-channel MOS transistor N1b is connected to the lower voltage power source VSS through the parallel connection of the resistance element R2b and the capacitance element C1b. The parallel connection of the capacitance element C1b and the resistance element R2b serves as a bias circuit of the N-channel MOS transistor N1b. A connection node 1b is between the source of the N-channel MOS transistor N1b and this bias circuit. A drain of the N-channel MOS transistor N1b is connected through the resistance element R1b to a drain of the P-channel MOS transistor P1b. A connection node 2b is between the drain of the N-channel MOS transistor N1b and the resistance element R1b and further connected to a gate of the P-channel MOS transistor P1a. A gate of the N-channel MOS transistor N1b is connected to an input terminal INb. A source of the P-channel MOS transistor P1b is connected to the higher voltage power source VDD. The connection node between the drain of the P-channel MOS transistor P1b and the resistance element R1b is connected to an output terminal OUTa.

The N-channel MOS transistor N1a has a load circuit composed of the P-channel MOS transistor P1a and the resistance element R1a and has a bias circuit composed of the resistance element R2a and the capacitance element C1a. A signal inputted from the input terminal INa is connected to the gate of the N-channel MOS transistor N1a and is amplified thereby. This amplifying circuit applies the output to the gate of the P-channel MOS transistor P1b connected to the node 2a. The P-channel MOS transistor P1b constitutes the amplifying circuit whose load circuit is composed of the N-channel MOS transistor N1b, the resistance elements R1b and R2b and the capacitance element C1b. A signal is amplified by the P-channel MOS transistor P1b and outputted to the output terminal OUTa. Similarly, the N-channel MOS transistor N1b is connected to a load circuit composed of the P-channel MOS transistor P1b and the resistance element R1b and to a bias circuit composed of the resistance element R2b and the capacitance element C1b, and a signal supplied from the input terminal INb is connected to the gate of the N-channel MOS transistor N1b and is amplified thereby. This amplifying circuit supplies the output to the gate of the P-channel MOS transistor P1a connected to the node 2b. The P-channel MOS transistor P1a constitutes the amplifying circuit whose load circuit is composed of the N-channel MOS transistor N1a, the resistance elements R1a and R2a and the capacitance element C1a. A signal is amplified by the P-channel MOS transistor P1a and outputted to the output terminal OUTb.

The amplifying circuit having the N-channel MOS transistor N1a or N1b as an amplifying element has the resistance element R2ab or R2b and the capacitance element C1a or C1b between its source and the lower voltage power source VSS as the bias circuit. In this bias circuit, the resistance element R2a or R2b operates mainly for a DC component, and the capacitance element C1a or C1b operates mainly as a bypass capacitor for a high frequency component. If a bias resistor exists between the source of the N-channel MOS transistor N1a or N1b and the lower voltage power source VSS, the signal outputted to the nodes 2a or 2b is a signal attenuated from the input signal. Since the resistance element R2a or R2b operates mainly for the DC component, the input signal can be greatly attenuated on the basis of the resistance value of the resistance element R2a or R2b. Also, for the high frequency component, the source of the N-channel MOS transistor N1a or N1b is set to a short-circuited state for the lower voltage power source VSS. Thus, this circuit amplifies the input signal. Therefore, the frequency property of this differential output circuit has the property having the peaks of: the attenuation for the DC component; and the amplification for the high frequency component, as shown by the solid line in FIG. 3.

Figure 4A:
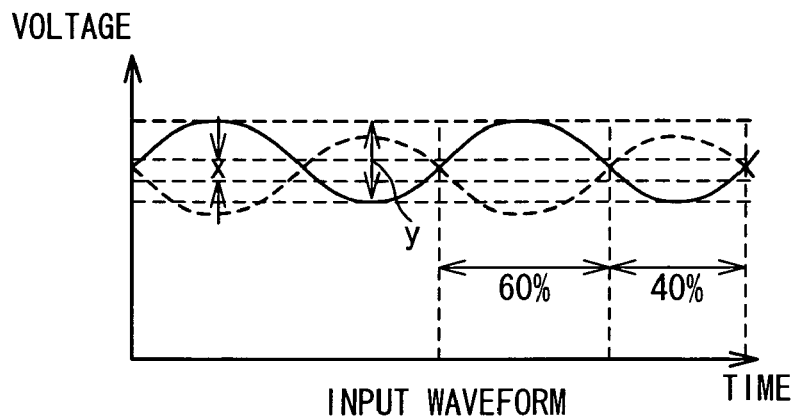
FIGS. 4A to 4C are diagrams showing input/output waveforms in the conventional differential output circuit and the differential output circuit in the first embodiment.

The signals supplied to the input terminals INa and INb serve as the differential signal. As shown in FIG. 4A, signals having opposite phases are superimposed on the respective offset voltages. If the offset voltages are equal (x=0) to each other and amplitudes y of the superimposition signals are also equal to each other, a signal with the duty of 50% is obtained. In the usual state, the respective offset voltages are the substantially similar voltages. However, as shown in FIG. 4A, there may be a case that a difference x is generated in the offset voltage. In that case, even if the amplitudes y of the superimposition signals are equal to each other, the duty ratio of the differential signal becomes 60:40. Thus, the symmetry cannot be kept.

Figure 4B:
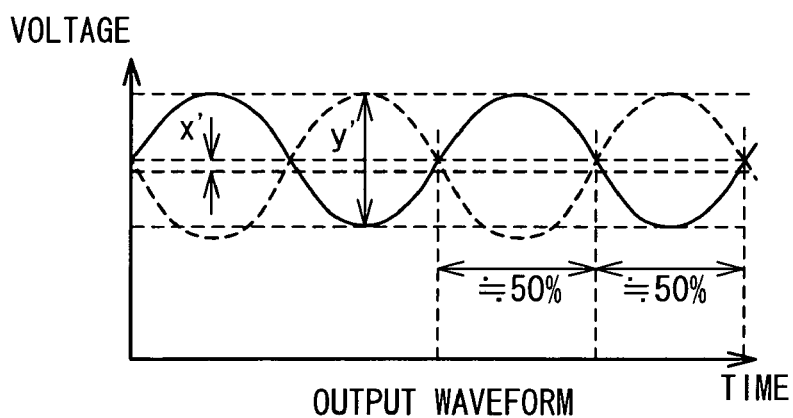
Figure 4C:
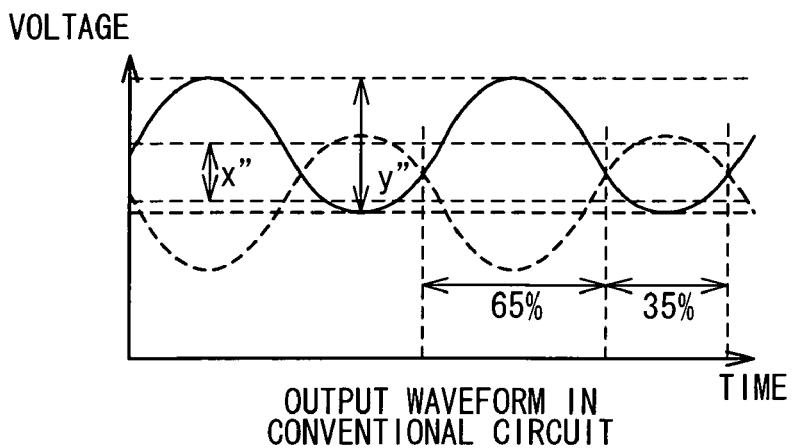

When this differential signal is supplied to the differential output circuit shown in FIG. 2, the DC component is attenuated, and the high frequency component is amplified. That is, a difference x' between the offset voltages is decreased as shown in FIG. 4B, because the respective offset voltages are attenuated. Moreover, an amplitude y' of the superimposition signal is amplified as shown in FIG. 4B because the signal is the high frequency component. Thus, the duty ratio between the differential output signals approaches 50:50, and this is consequently improved.

Figure 5:
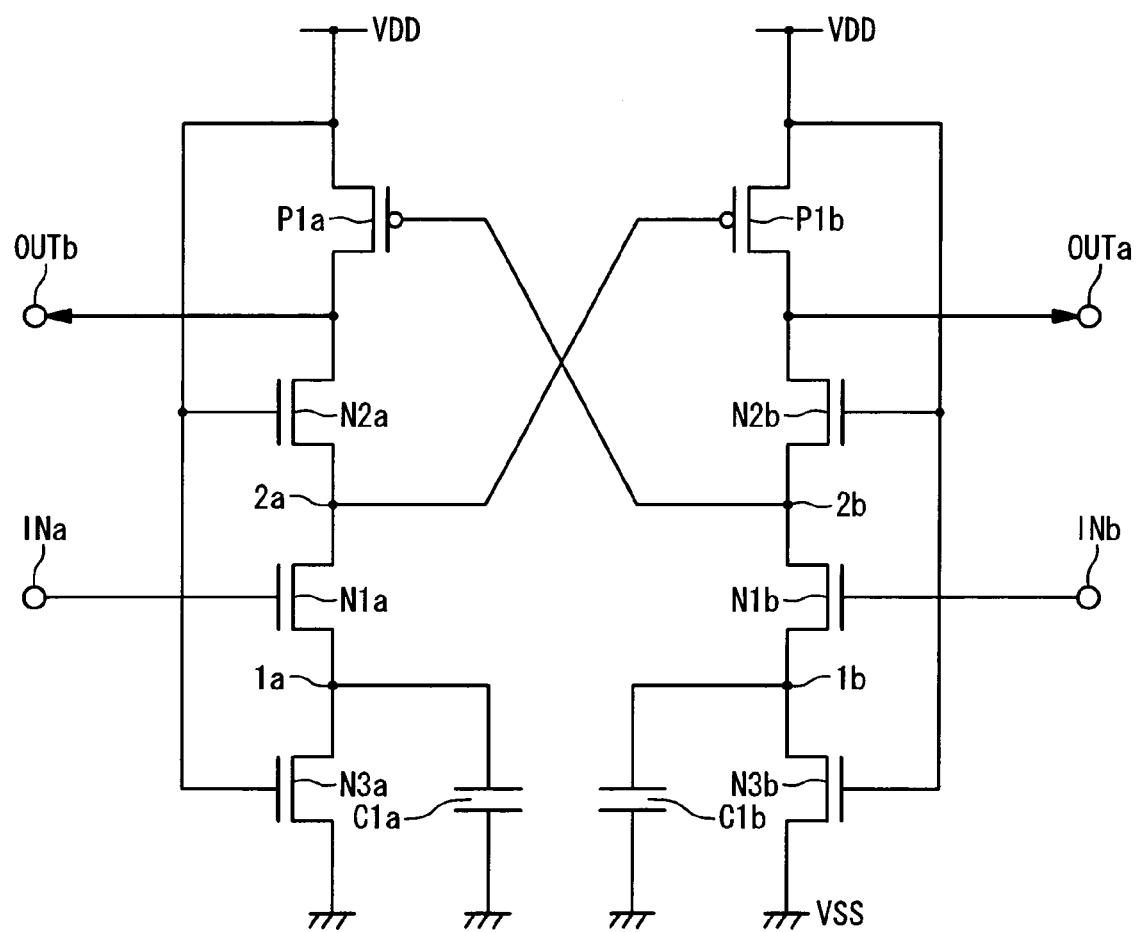
FIG. 5 is a circuit diagram showing the configuration of the differential output circuit according to a second embodiment of the present invention.

FIG. 5 shows a circuit diagram showing the configuration of the differential output circuit according to the second embodiment of the present invention. The resistance elements R1a, R2a, R1b and R2b in FIG. 2 are replaced by N-channel MOS transistors N2a, N3a, N2b and N3b, and the resistance elements R1a, R2a, R1b and R2b are attained by using channel resistors of the N-channel MOS transistors. That is, each gate of the N-channel MOS transistors N2a, N3a, N2b and N3b is connected to the higher voltage power source VDD, and each transistor is always on. The ON resistance value of each transistor is set in accordance with the size of the transistor.

Figure 6:
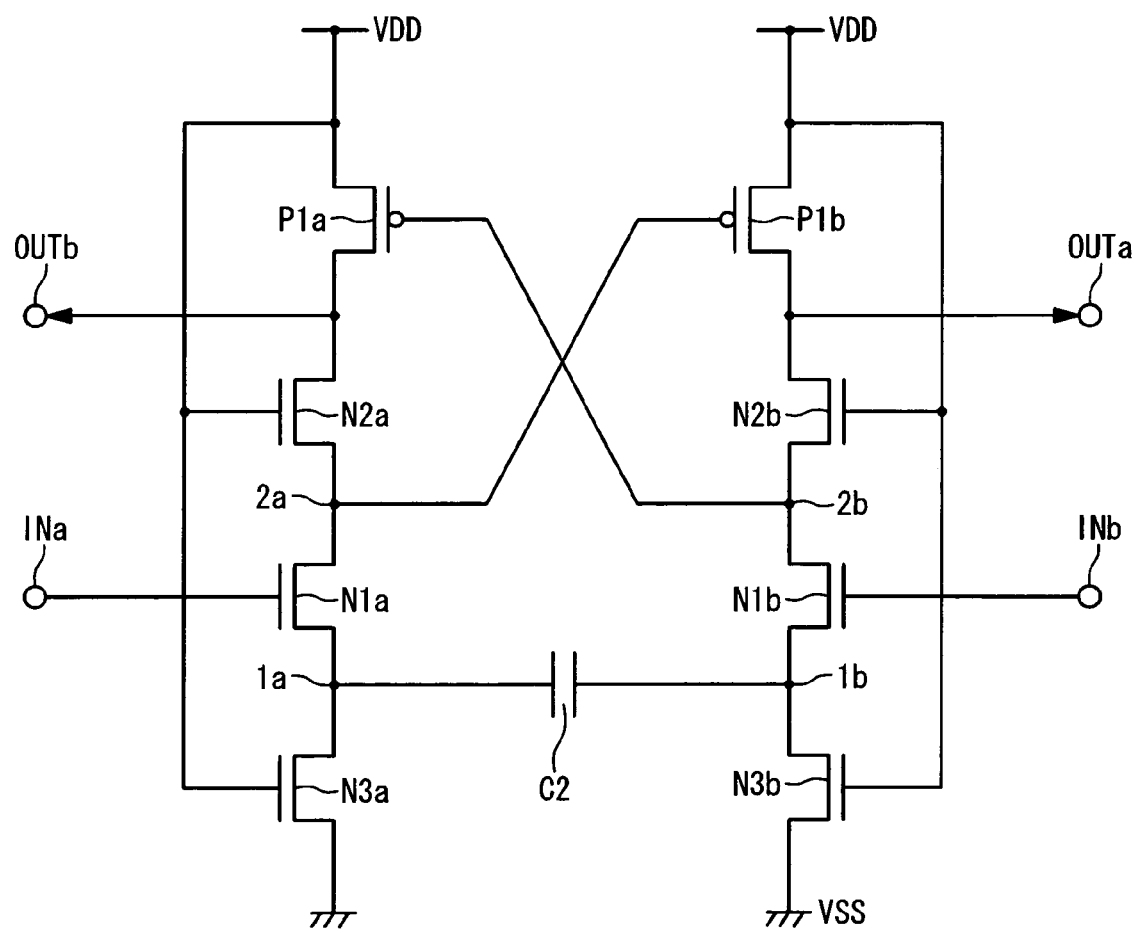
FIG. 6 is a circuit diagram showing the configuration of the differential output circuit according to a third embodiment of the present invention.

FIG. 6 is a circuit diagram showing the configuration of the differential output circuit according to the third embodiment of the present invention, in which the capacitance elements C1a and C1b in FIG. 5 are replaced by a capacitance element C2. The capacitance elements C1a and C1b are charged and discharged with the superimposition signals. The signal on the input terminal INa side and the signal on the input terminal INb side are signals having phases opposite to each other, and their amplitudes are substantially equal. That is, the charging of the capacitance element C1a and the discharging of the capacitance element C1b, and the discharging of the capacitance element C1a and the charging of the capacitance element C1b are alternately executed. Thus, it may be considered that the charges are shifted between those capacitance elements during the charging/discharging operations. Thus, even if the connection ends of the capacitance elements C1a and C1b to the lower voltage power source VSS are connected to each other, its connection node seems to be virtually connected to the lower voltage power source VSS. This implies that the capacitance elements C1a and C1b can be replaced by the capacitance element C2, and the capacitance elements can be integrated into one unit.

Figure 7:
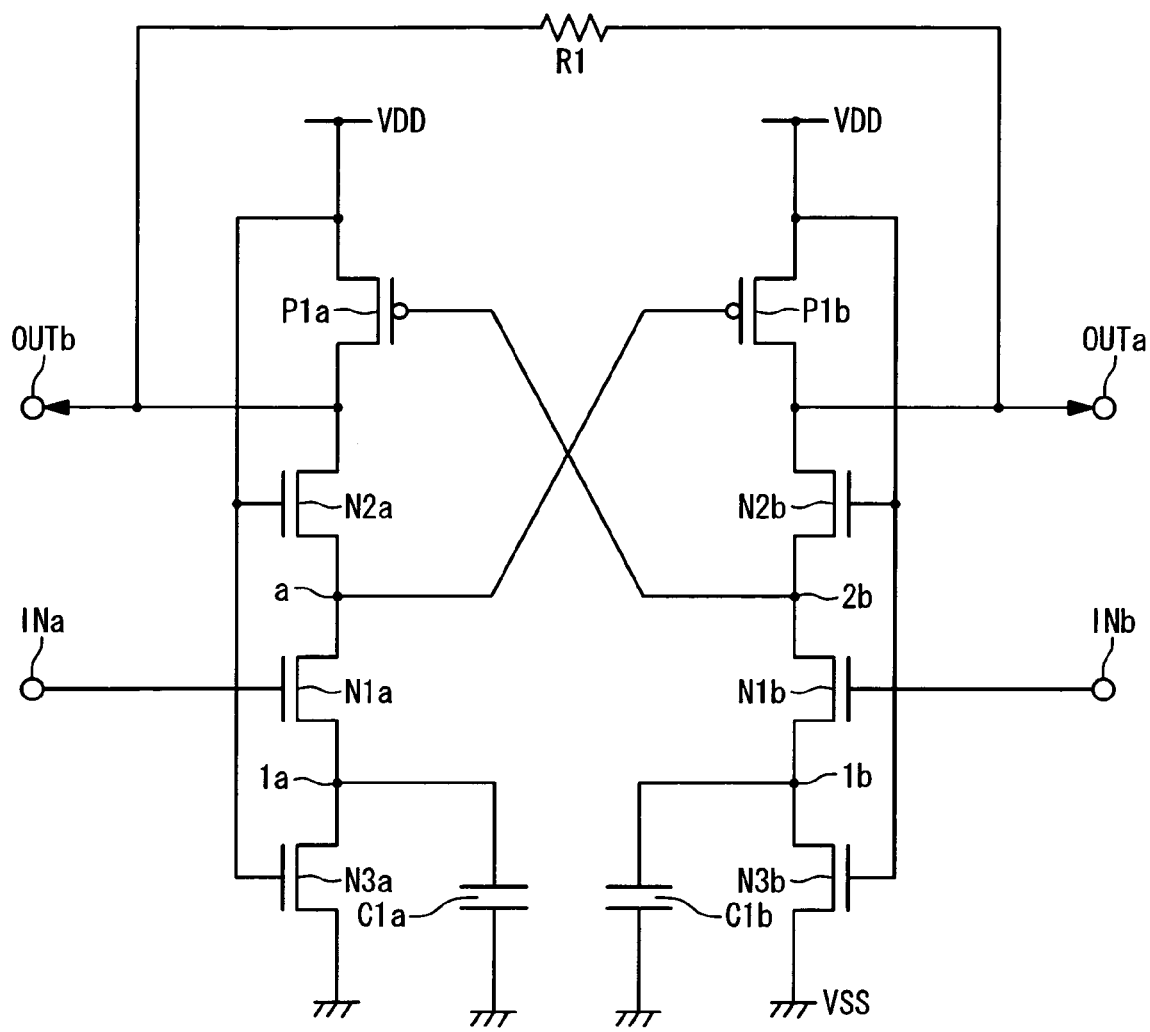
FIG. 7 is a circuit diagram showing the configuration of the differential output circuit according to a fourth embodiment of the present invention.

FIG. 7 is a circuit diagram showing the configuration of the differential output circuit according to the fourth embodiment of the present invention, and the differential output circuit has a negative feedback circuit from an output terminal to an input side. This differential output circuit is designed such that a feedback resistance element R1 is inserted between the output terminals OUTa and OUTb of the differential output circuit shown in FIG. 2. Since the negative feedback is applied by the resistance element R1, a gain is limited. Thus, a flat frequency band in a frequency property of a gain is enlarged.

Figure 3:
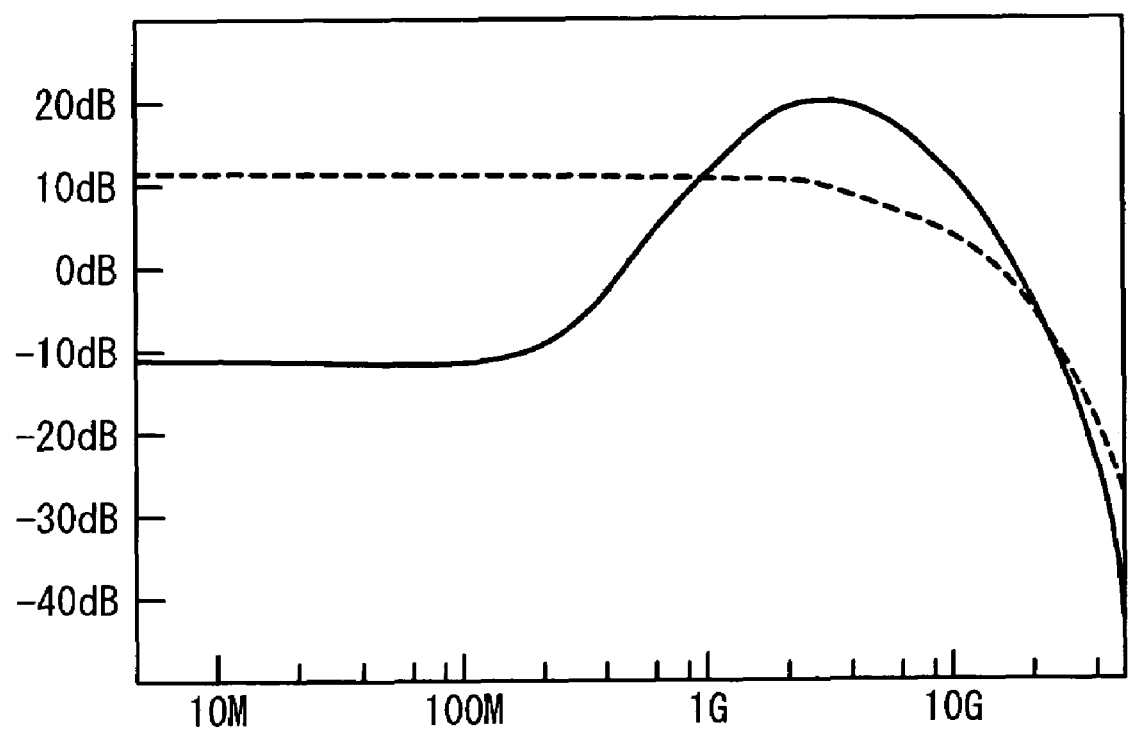
FIG. 3 is a diagram showing frequency characteristics in the conventional differential output circuit and the differential output circuit in the first embodiment.
Figure 8:
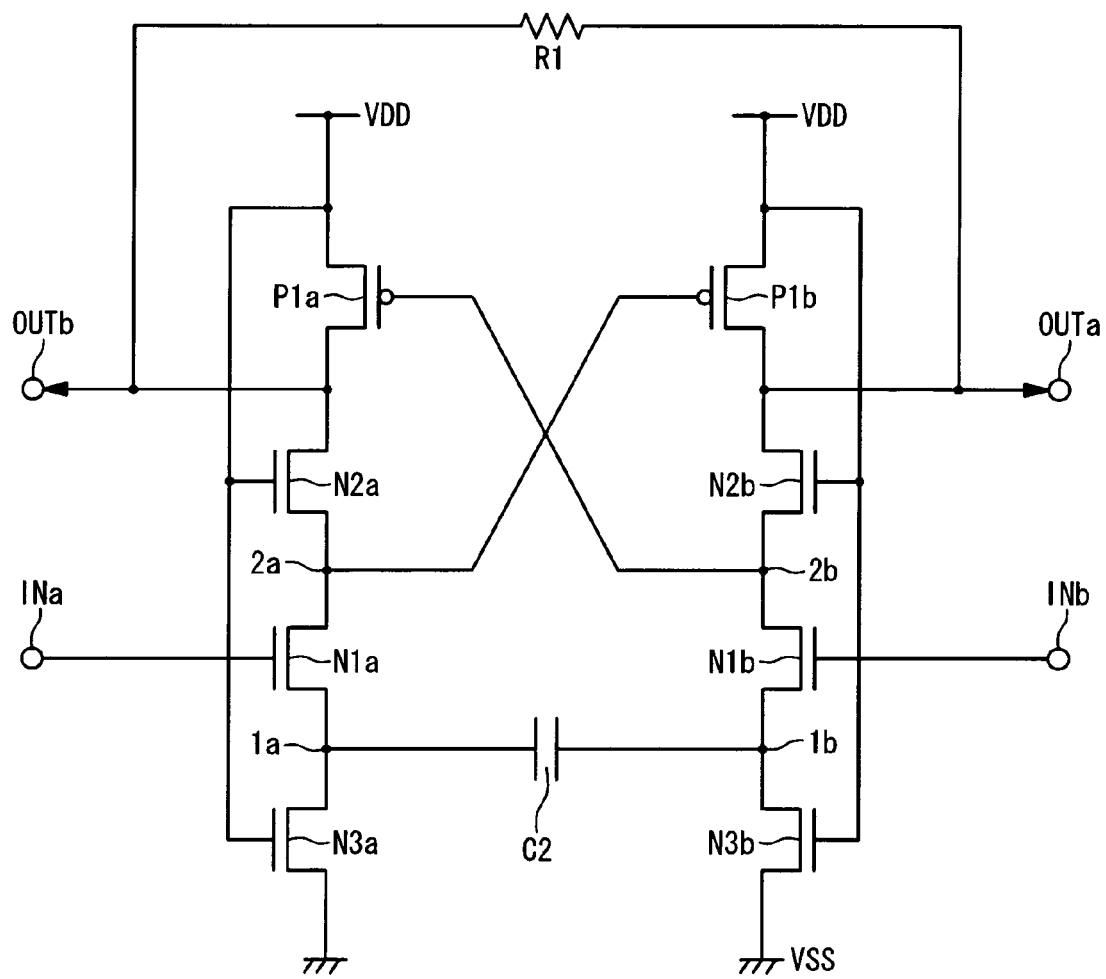
FIG. 8 is a circuit diagram showing the configuration of the differential output circuit according to a fifth embodiment of the present invention.

FIG. 8 is a circuit diagram showing the configuration of the differential output circuit according to the fifth embodiment of the present invention, and the differential output circuit has the negative feedback circuit from the output terminal to the input side, similarly to the differential output circuit shown in FIG. 7. This differential output circuit is designed such that the feedback resistance element R1 is inserted between the output terminals OUTa and OUTb of the differential output circuit shown in FIG. 6. Since the negative feedback is applied by the resistance element R1, the gain is limited. Thus, the flat frequency band in the frequency property of the gain is enlarged. The frequency property of the gain indicated by the solid line in FIG. 3 is the result of the simulation after circuit constants are set in this circuit. Thus, the band of the flat frequency property becomes wide, and the attenuation in which the gain to the DC component is great such as −10 dB is obtained.

Figure 9:
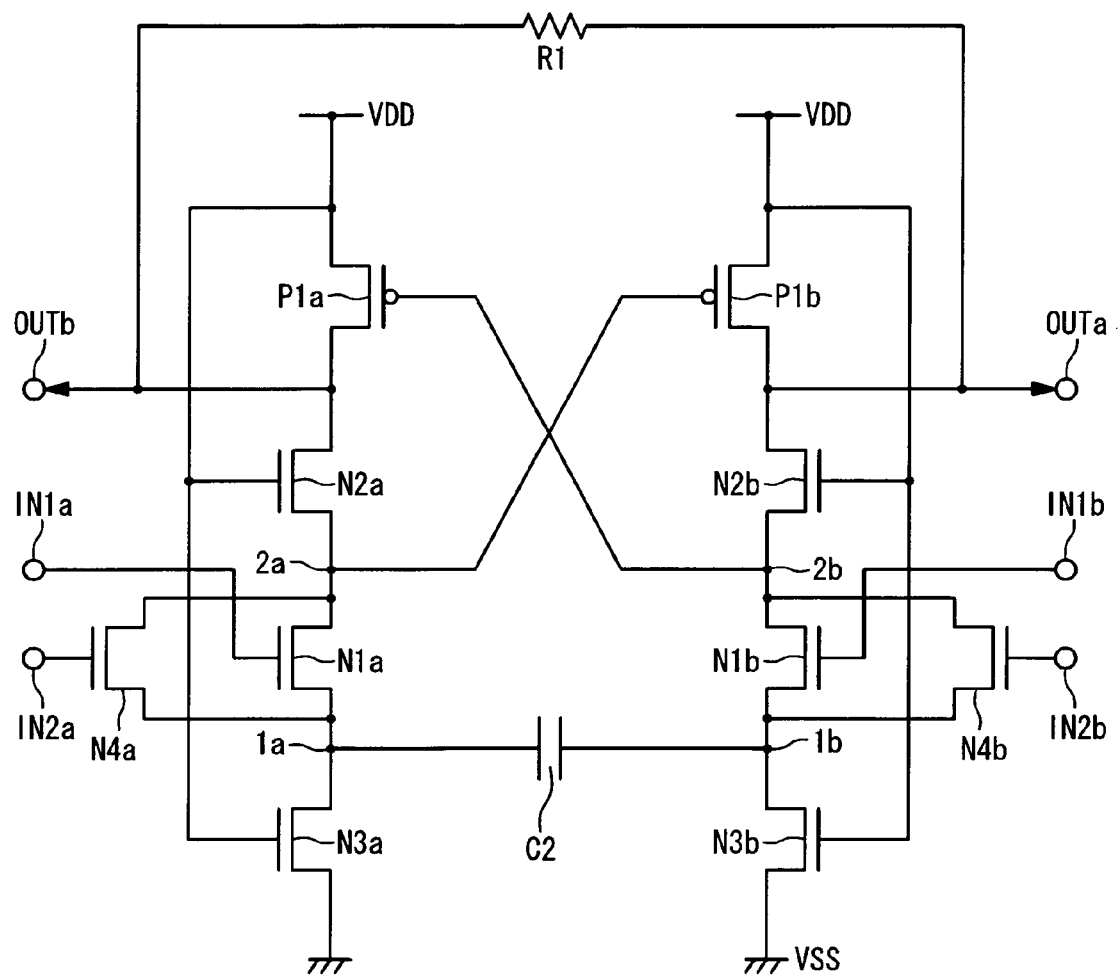
FIG. 9 is a circuit diagram showing the configuration of the differential output circuit according to a sixth embodiment of the present invention.

FIG. 9 is a circuit diagram showing the configuration of the differential output circuit according to the sixth embodiment of the present invention, in which a sum of two differential signals is supplied to a signal input section of the differential output circuit shown in FIG. 8. An N-channel MOS transistor N4a is connected in parallel to the N-channel MOS transistor N1a. A gate of the N-channel MOS transistor N4a is connected to an input terminal IN2a to which the second differential signal is inputted. Also, an N-channel MOS transistor N4b is connected in parallel to the N-channel MOS transistor N1b. A gate of the N-channel MOS transistor N4b is connected to an input terminal IN2b to which the second differential signal is inputted. In this way, since the transistors are connected in parallel, the logical sum of input signals can be determined. Moreover, since the transistors are connected in parallel, the logical sum of many signals can be determined. Also, although not shown, if the transistors are connected in series, the logical product can be determined. Since the transistors are combined in series and in parallel, different logics can be combined.

Figure 10A:
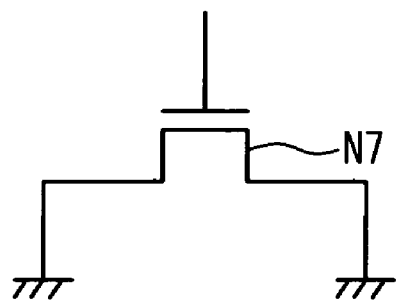
FIGS. 10A to 10C are diagrams showing examples in which a capacitance element is composed of one or more MOS transistors.
Figure 10B:
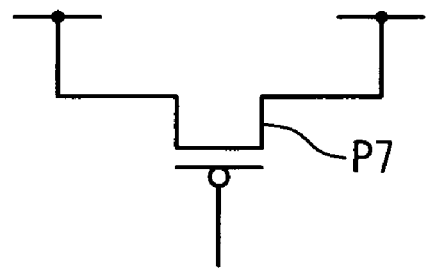
Figure 10C:
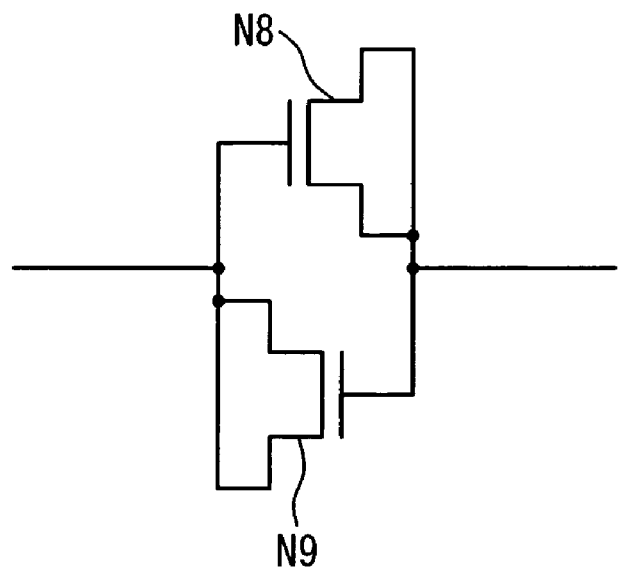

The foregoing capacitance elements C1a, C1b and C2 can be attained by using the N-channel MOS transistor and/or the P-channel MOS transistor, as shown in FIGS. 10A to 10C. That is, the capacitance elements C1a and C1b connected to the lower voltage power source VSS are preferably attained by using the gate capacitance of an N-channel MOS transistor N7 as shown in FIG. 10A. Also, the capacitance element connected to the higher voltage power source VDD is preferably attained by using the gate capacitance of a P-channel MOS transistor P7 as shown in FIG. 10B. Moreover, the capacitance element C2 is preferably attained by using the gate capacitances of N-channel MOS transistors N8, N9 as shown in FIG. 10C.

In this way, the differential output circuit of the present invention has the high gain in the high frequency band and attenuates the DC component. With this property, the offset difference of the differential signal becomes small in the output signal. Thus, the distortion compensation for the duty ratio is attained.

What is claimed is:

1. A differential output circuit, comprising:
a bias circuit connected with a first voltage;
an input circuit section comprising first and second MOS transistors of a first conductive type, wherein said first and second MOS transistors are connected with said first voltage through said bias circuit, and gates of said first and second MOS transistors receive a differential input signal;
first and second resistance elements; and
third and fourth MOS transistors of a second conductive type connected with said first and second MOS transistors through said first and second resistance elements, respectively, and connected with a second voltage,
wherein a first connection node between said first MOS transistor and said first resistance element is connected with a gate of said fourth MOS transistor,
wherein a second connection node between said second MOS transistor and said second resistance element is connected with a gate of said third MOS transistor,
wherein a differential output signal is outputted from a first output node between said first resistance element and said third MOS transistor and a second output node between said second resistance element and said fourth MOS transistor in response to said differential input signal and
wherein said bias circuit comprises:
a third resistance element connected between said first MOS transistor and the first voltage;
a fourth resistance element connected between said second MOS transistor and the first voltage; and
a capacitance element connected between a first node between said first MOS transistor and said third resistance element and a second node between said second MOS transistor and said fourth resistance element.

2. The differential output circuit according to claim 1, wherein said third and fourth resistance elements are constituted by fifth and sixth MOS transistors of the first conductive type which have gates connected with the second voltage, respectively.

3. The differential output circuit according to claim 1, wherein said capacitance element is constituted by a first additional MOS transistor having a source and a drain connected to said first node and a gate connected to said second node and a second additional MOS transistor having a source and a drain connected to said second node and a gate connected to said first node.

4. A differential output circuit, comprising:

a bias circuit connected with a first voltage;

an input circuit section comprising first and second MOS transistors of a first conductive type, wherein said first and second MOS transistors are connected with said first voltage through said bias circuit, and gates of said first and second MOS transistors receive a differential input signal;

first and second resistance elements;

third and fourth MOS transistors of a second conductive type connected with said first and second MOS transistors through said first and second resistance elements, respectively, and connected with a second voltage; and fifth and sixth MOS transistors of the first conductive type which have gates connected with a second differential input signal, wherein a first connection node between said first MOS transistor and said first resistance element is connected with a gate of said fourth MOS transistor, wherein a second connection node between said second MOS transistor and said second resistance element is connected with a gate of said third MOS transistor, and wherein a differential output signal is outputted from a first output node between said first resistance element and said third MOS transistor and a second output node between said second resistance element and said fourth MOS transistor in response to said differential input signal.

5. The differential output circuit according to claim 4, wherein said fifth and sixth MOS transistors are respectively provided in series to said first and second MOS transistors.

6. The differential output circuit according to claim 4, wherein said fifth and sixth MOS transistors are respectively provided in parallel to said first and second MOS transistors.

7. The differential output circuit according to claim 4, wherein said first and second resistance elements are constituted by seventh and eighth MOS transistors of the first conductive type which have gates connected with the second voltage, respectively.

8. The differential output circuit according to claim 4, wherein said bias circuit comprises:

a third resistance element connected between said first MOS transistor and the first voltage;

a fourth resistance element connected between said second MOS transistor and the first voltage; and a capacitance element connected between said first MOS transistor and the first voltage and between said second MOS transistor and the first voltage.

9. The differential output circuit according to claim 8, wherein said third and fourth resistance elements are constituted by ninth and tenth MOS transistors of the first conductive type which have gates connected with the second voltage, respectively.

10. The differential output circuit according to claim 4, further comprising a fifth resistance element between said first and second output nodes.

11. The differential output circuit according to claim 10, wherein said fifth resistance element is constituted by an eleventh MOS transistor of the first conductive type which has a gate connected with a predetermined voltage.

* * * * *